(12) United States Patent
Lee et al.

(10) Patent No.: US 10,334,670 B2
(45) Date of Patent: Jun. 25, 2019

(54) DRIVER SYSTEM

(71) Applicant: Yu-Lin Lee, New Taipei (TW)

(72) Inventors: Yu-Lin Lee, New Taipei (TW);
Kuo-Chung Huang, New Taipei (TW)

(73) Assignee: Yu-Lin Lee, New Taipei (TW)

( * ) Notice: Subject to any disclaimer, the term of this patent is extended or adjusted under 35 U.S.C. 154(b) by 0 days.

(21) Appl. No.: 15/988,536

(22) Filed: May 24, 2018

(65) Prior Publication Data

US 2018/0343715 A1 Nov. 29, 2018

(30) Foreign Application Priority Data

May 27, 2017 (TW) .............................. 106117768 A (51) Int. Cl.
| H05B 37/02 | (2006.01) |
| H05B 33/08 | (2006.01) |
| G08C 23/04 | (2006.01) |
| H03K 23/54 | (2006.01) |

(52) U.S. Cl.
CPC ......... *H05B 33/0815* (2013.01); *G08C 23/04* (2013.01); *H05B 37/0272* (2013.01); *H03K 23/542* (2013.01)

(58) Field of Classification Search
CPC .. H04N 5/45; H04N 5/4403; H04N 21/42204; H04N 21/44231; H05B 37/0227; H05B 37/0245; H05B 37/0272
USPC .......................... 348/114, 565, 734; 315/149
See application file for complete search history.

(56) References Cited

U.S. PATENT DOCUMENTS

| 4,901,003 A * | 2/1990 | Clegg ................. G01R 31/023 324/539 |
| 5,450,068 A | 9/1995 | Steffen |
| 5,828,178 A * | 10/1998 | York .................... H05B 41/042 315/151 |
| 5,839,816 A | 11/1998 | Varga et al. |
| 7,268,830 B2 * | 9/2007 | Lee ........................ G06F 3/0481 348/565 |
| 2006/0139451 A1 * | 6/2006 | Yoneno ................ H04N 5/4403 348/114 |

(Continued)

FOREIGN PATENT DOCUMENTS

| CN | 1087034 | 5/1994 |
| CN | 101197108 | 6/2008 |
| CN | 101621878 | 1/2010 |

(Continued)

OTHER PUBLICATIONS

Taiwan Search Report for Application No. 100117708.

(Continued)

*Primary Examiner* — Tung X Le
(74) *Attorney, Agent, or Firm* — Jackson IPG PLLC; Demian K. Jackson (57) ABSTRACT

The driver system according to the invention includes an infrared receiver module and a Johnson counter. The infrared receiver module receives an infrared signal and performs filtering using a low-pass filter to convert the infrared signal into a driving signal which is transmitted to the Johnson counter. Upon receiving the driving signal, the output terminals of the Johnson counter are sequentially activated to output a control signal for shifting the operation of an electrical device from one operation state to another.

14 Claims, 5 Drawing Sheets

(56) References Cited

U.S. PATENT DOCUMENTS

2007/0164682 A1* 7/2007 Olson .................. G09G 3/3406
315/149
2011/0317069 A1* 12/2011 McRae ................... H04N 5/60
348/552

FOREIGN PATENT DOCUMENTS

| CN | 201986225 | 9/2011 |
| CN | 102333400 | 1/2012 |
| CN | 103152905 | 6/2013 |
| CN | 203691708 | 7/2014 |
| CN | 105826898 | 8/2016 |
| CN | 106612577 | 5/2017 |
| DE | 3991599 | 2/1989 |
| GB | 2193939 | 2/1988 |
| TW | M393951 | 12/2010 |
| TW | 201218862 | 5/2012 |

OTHER PUBLICATIONS

International Search Report for PCT/CN2017/086272.
Search Report for European Application No. 18174194.3 dated Oct. 23, 2018.
Written Opinion for European Application No. 18174194.3 dated Oct. 23, 2018.

* cited by examiner

DRIVER SYSTEM

PRIORITY CLAIM

This application claims priority to R.O.C. Patent Application No. 106117768 filed May 27, 2017, the entirety of which is incorporated herein by reference.

BACKGROUND OF INVENTION

1. Field of the Invention

The present invention relates to a driver system, in which a simple circuit architecture is used to output a control signal following the counting sequence of a counter, thereby shifting the operation of an electrical device from one operation state to another.

2. Description of Related Art

Remote controls are necessities of modern life. With remote control, one can conduct various operations of electrical devices such as televisions remotely. Since different electrical devices require corresponding remote controllers, we end up with many remote controllers. It is logical that complicated devices require complicated coding schemes as well as dedicated remote controllers, however, for something as mundane as dimming the light bulb, a simple and generic solution is in demand For typical remote control techniques including infrared, radio or Bluetooth technology, transmitter and the receiver need to be paired with each other, that is, the receiver will only respond to the remote control signal from the transmitter that is paired with.

The conventional remote control also requires a decoding scheme or a demodulation function, which can decode or demodulate the received remote control signal to form a corresponding response, which may involve a programmed control unit for establishing the required action program and executing the program based upon the received remote control signal. Therefore, the overall circuit design is complicated.

SUMMARY OF THE INVENTION

In a primary aspect, provided herein is a driver system, where a simple circuit architecture is used to output a control signal following the counting sequence of a counter, thereby shifting the operation of an electrical device from one operation state to another.

According to the invention, the driver system comprises an infrared receiver module and a Johnson counter. The infrared receiver module comprises a receiver unit and a low-pass filter, wherein the receiver unit is adapted for receiving an infrared signal, and the low-pass filter is adapted for filtering the infrared signal to generate a driving signal. The Johnson counter has an input terminal and a plurality of output terminals, and is adapted to receive the driving signal via the input terminal and sequentially activate the output terminals, one at a time, following a predetermined counting sequence, thereby outputting a control signal for driving an electrical device via the activated output terminals.

The invention mainly involves utilization of a simple circuit architecture to develop a driver system that is adapted to output a control signal following a predetermined counting sequence, such that the operation of an electrical device is shifted from one state to another. For instance, the driver system disclosed herein is useful for driving a lighting device, and different control signals are responsible for placing the lighting device at corresponding operation states (such as ON and OFF, light and shade, and emission of light with particular color temperature(s), etc.) and can be remotely controlled with a remote controller.

According to the preferred embodiments, the driver system further comprises a voltage regulation unit. The voltage regulation unit comprises a plurality of resistors and a summing amplifier. The resistors are connected at one ends thereof to the output terminals of the Johnson counter, respectively, and connected at the other ends thereof to the summing amplifier, so that the control signal from the activated output terminal is converted into a control voltage for driving the electrical device.

According to the preferred embodiments, the driver system further comprises a plurality of diodes and a voltage regulation unit. The diodes are connected to the output terminals of the Johnson counter, respectively. The voltage regulation unit comprises a plurality of resistors and a divider resistor. The resistors are connected to the diodes, respectively, and connected in series with the divider resistor, so that a control voltage for driving the electrical device is output from the resistor connected to the activated output terminal according to the control signal.

According to the preferred embodiments, the driver system further comprises a plurality of 3-state buffers and a voltage regulation unit. The 3-state buffers are connected to the output terminals of the Johnson counter, respectively, to isolate the control signal. The voltage regulation unit comprises a plurality of resistors and a divider resistor. The resistors are connected with the 3-state buffers, respectively, and connected in series with the divider resistor, so that a control voltage for driving the electrical device is output from the resistor connected to the activated output terminal according to the control signal.

According to the preferred embodiments, one end of the divider resistor is connected in series with the resistors, and the other end of the divider resistor is grounded.

According to the preferred embodiments, the electrical device is a lighting device comprising a driving unit and at least one light emitting diode. The driving unit comprises a rectifier circuit for connecting an AC power source and converting the AC power source into a DC power source, and a switching power supply having a primary side and a secondary side. The primary side is connected with the rectifier circuit and the voltage regulation unit. The secondary side is adapted to supply a predetermined level of power to the at least one light emitting diode.

According to the preferred embodiments, the low-pass filter is a capacitor.

DETAILED DESCRIPTION OF THE INVENTION

The above and other objects, features and effects of the invention will become apparent with reference to the following description of the preferred embodiments taken in conjunction with the accompanying drawings.

Figure 1:
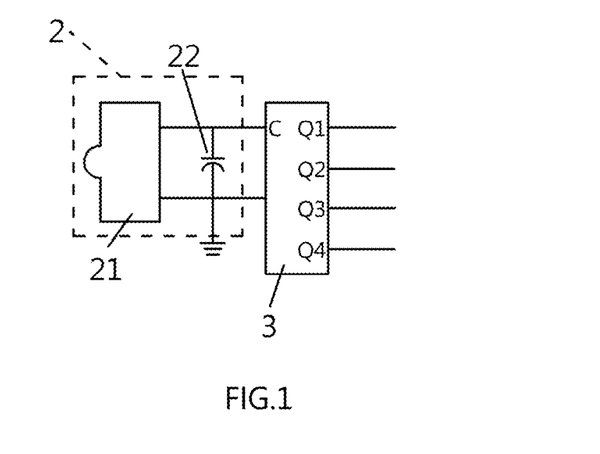
FIG. 1 is a schematic diagram showing the circuit of the driver system according to the first embodiment of the present invention.

FIG. 1 is a schematic diagram showing the circuit of the driver system according to the first embodiment of the invention. The driver system disclosed herein comprises an infrared receiver module 2 and a Johnson counter 3.

The infrared receiver module 2 includes a receiver unit 21 and a low-pass filter 22. The receiver unit 21 is configured to receive an infrared signal, and the low-pass filter 22 is configured to filter the infrared signal based on a specific frequency range to generate a driving signal. The low-pass filter 22 is adapted to filter out the high-frequency components of the infrared signal and allow the low-frequency components to pass. The low-pass filter 22 may be a capacitor.

The Johnson counter 3 includes an input terminal C and a plurality of output terminals Q1, Q2, Q3, and Q4. The driving signal described above is received by the input terminal C. Responsive to receiving the driving signal, the Johnson counter 3 sequentially activates the output terminals Q1, Q2, Q3, and Q4, one at a time, following a predetermined counting sequence, thereby outputting a control signal. The Johnson counter 3 is a ring counting device and is adapted to sequentially output control signals from the output terminals Q1, Q2, Q3, and Q4 according to the waveform formed by the received driving signal. It is known in the art that the number of output terminals is not limited to that described herein, and additional Johnson counter(s) may be included in the system. A plurality of Johnson counters can be connected in series to constitute more output terminals.

The control signals output from the different output terminals Q1, Q2, Q3, and Q4 of the Johnson counter 3 may place an electrical device to operate at different states (such as the operating states of ON and OFF, light and shade, and the color temperature of a lighting device). By virtue of the driver system described above, various types of remote control units may be used to control the operating states of an electrical device without pairing the remote control unit with the electrical device, and without conducting a decoding or demodulation procedure. That is to say, a user can arbitrarily press any key on a remote control unit to achieve the purpose of remote control of the electrical device.

Figure 2:
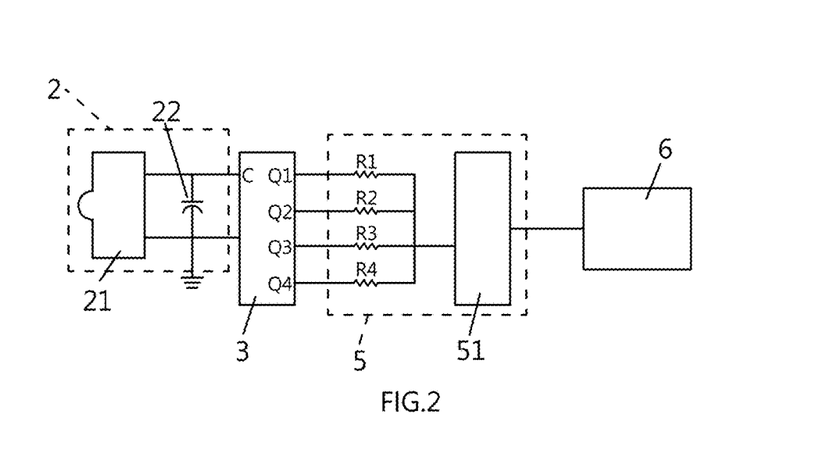
FIG. 2 is a schematic diagram showing the circuit of the driver system according to the second embodiment of the present invention.

FIG. 2 is a schematic diagram showing the circuit of the driver system according to the second embodiment of the invention. The driver system disclosed herein comprises an infrared receiver module 2, a Johnson counter 3, and a voltage regulation unit 5. The second embodiment differs from the first embodiment described above in including the voltage regulation unit 5 which is coupled to the Johnson counter 3. The voltage regulation unit 5 includes a plurality of resistors R1~R4 and a summing amplifier 51. The resistors R1~R4 are connected at one ends thereof to the output terminals Q1, Q2, Q3 and Q4, respectively, and connected at the other ends thereof to the summing amplifier 51. The control signal output from the activated output terminal Q1, Q2, Q3 or Q4 is transmitted through, and therefore converted by, the resistor connected to the activated output terminal Q1, Q2, Q3 or Q4 and the summing amplifier 51, into a specific control voltage. According to this embodiment, a lighting device 6 is driven by the driver system disclosed herein, and the output control voltage is isolated due to the presence of the summing amplifier 51. It is known in the art that the number of resistors corresponds to the number of output terminals.

Figure 3:
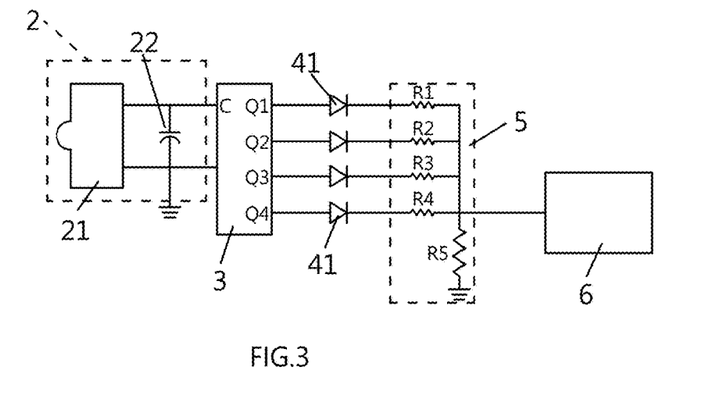
FIG. 3 is a schematic diagram showing the circuit of the driver system according to the third embodiment of the present invention.

FIG. 3 is a schematic diagram showing the circuit of the driver system according to the third embodiment of the invention. The driver system disclosed herein comprises an infrared receiver module 2, a Johnson counter 3, a plurality of diodes 41, and a voltage regulation unit 5.

The third embodiment differs from the first embodiment above in including the diodes 41 and the voltage regulation unit 5. The diodes 41 are coupled between the output terminals Q1, Q2, Q3, and Q4 of the Johnson counter 3 and the resistors R1~R4 of the voltage regulation unit 5, respectively.

The voltage regulation unit 5 includes the resistors R1~R4 connected to the diodes 41 and a divider resistor R5. The resistors R1~R4 and the divider resistor R5 are responsible for outputting a corresponding control voltage according to the control signal, wherein the resistors R1~R4 connected in series to the diodes 41 are connected in parallel with each other and connected in series with one end of the divider resistor R5. The other end of the divider resistor R5 is grounded, allowing the resistors R1~R4 and the divider resistor R5 to generate different control voltages.

Upon receipt of a driving signal via the input terminal C, the Johnson counter 3 sequentially activates the output terminals Q1, Q2, Q3, and Q4, one at a time, following the predetermined counting sequence, thereby outputting a control signal. The control signal output from the activated one of the output terminals Q1, Q2, Q3, Q4 is transmitted to the diode 41 coupled to the activated output terminal. At the time, because of their unidirectional conductivity, the diodes 41 not receiving the control signal are reverse-biased, while the diode 41 receiving the control signal transmits the control signal to the resistor connected thereto. Afterwards, the conducted resistor and the divider resistor output a corresponding control voltage for driving an electrical device. By way of an example, a lighting device 6 is driven in this embodiment.

Figure 4:
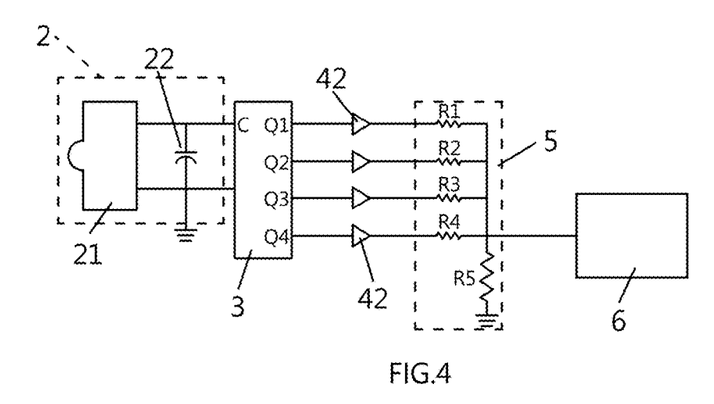
FIG. 4 is a schematic diagram showing the circuit of the driver system according to the fourth embodiment of the present invention.

FIG. 4 is a schematic diagram showing the circuit of the driver system according to the fourth embodiment of the invention. The driver system disclosed herein comprises an infrared receiver module 2, a Johnson counter 3, a plurality of 3-state buffers 42, and a voltage regulation unit 5. The fourth embodiment differs from the third embodiment above in including the 3-state buffers 42 (instead of diodes) coupled between the Johnson counter 3 and the voltage regulation unit 5. The 3-state buffers 42 are connected to the output terminals Q1, Q2, Q3, and Q4 of the Johnson counter 3, respectively, and adapted to receive the control signal and output an isolated control signal. The voltage regulation unit 5 includes a plurality of resistors R1~R4 connected to the 3-state buffers 42, respectively, and a divider resistor R5.

Upon receipt of a driving signal via the input terminal C, the Johnson counter 3 sequentially activates the output terminals Q1, Q2, Q3, and Q4, one at a time, following the predetermined counting sequence, thereby outputting a control signal. The control signal output from the activated one of the output terminals Q1, Q2, Q3, Q4 is transmitted to the 3-state buffer 42 coupled to the activated output terminal. At the time, the 3-state buffers 42 not receiving the control signal are in a high impedance state at their output ends and, as a result, these output ends are isolated from the rest part of the 3-state buffers 42. In contrast, the 3-state buffer 42 that receives the control signal directly transmits the control signal to the voltage regulation unit 5. Since the 3-state buffers 42 not receiving the control signal are in a high impedance state, the transmission of the control signal to the voltage regulation unit 5 is not interfered. Afterwards, the isolated control signal is transmitted to the resistor, which in turn outputs a corresponding control voltage for driving an electrical device. By way of example, a lighting device 6 is driven in this embodiment.

Figure 5:
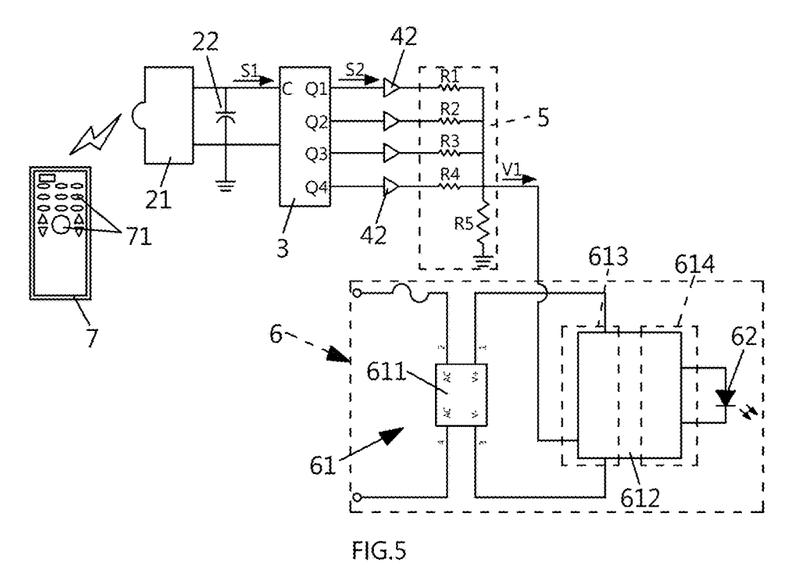
FIG. 5 is a schematic diagram showing the operation of the driver system according to the fourth embodiment of the present invention.

The operation of the invention is illustrated in FIG. 5, taking the fourth embodiment as an example. The lighting device 6 includes a driving unit 61 and at least one light emitting diode 62. The driving unit 61 includes a rectifier circuit 611 and a switching power supply 612. The rectifier circuit 611 is adapted for connection to an AC power source and for converting the AC power source into a DC power source. The switching power supply 612 has a primary side 613 and a secondary side 614. The primary side 613 is connected with the rectifier circuit 611 and the voltage regulation unit 5, and is connected in parallel with the voltage regulation unit 5.

The driver system according to the invention is controlled in a wireless manner and collaborated with a remote control unit 7, as shown in FIG. 5. The remote control unit 7 is adapted to function using the infrared transmission technology, which may by way of example be any appliance remote controller commonly used at home. A user may press a key 71 on the remote control unit 7 to send out a driving signal. The wireless transmission of the driving signal is based on an infrared transmission protocol which may vary from one remote controller to another, and pressing different keys 71 will send out different coded signals. The driver system receives the driving signal S1 via the receiver unit 21. The driving signal S1, after being processed by the low-pass filter 22, is transmitted to the Johnson counter 3.

The driving signal S1 having a pulse waveform is received by the input terminal C of the Johnson counter 3, and the output terminals Q1, Q2, Q3 and Q4 are sequentially activated to output control signals following the predetermined counting sequence. For example, the pulse waveform generated by pressing a key 71 once activates the output terminal Q1 to output a control signal, whereas the pulse waveform generated by successively pressing the key 71 twice activates the output terminal Q2 to output a control signal. In the case where a key 71 is pressed to generate a pulse waveform and the output terminal Q1 is activated to output a control signal S2, the control signal S2 is transmitted to the resistor R1 and the divider resistor R5 via the 3-state buffer 42 connected to the output terminal Q1, thereby outputting a control voltage V1 to the driver unit 61 of the lighting device 6. Afterwards, the primary side 613 of the switching power supply 612 receives the control voltage V1, and a predetermined level of power is output from the secondary side 614 to drive the light emitting diode 62 to emit light. The driver unit 61 is adapted to supply a variety of power levels with different control voltages. Different power levels may drive the light emitting diode 62 to emit light with different brightness.

For example, pressing a key 71 once may place the lighting device 6 to be at its maximum brightness state. Alternatively, successively pressing the key 71 twice may cause the lighting device 6 to emit light with maximum brightness and then decrease the brightness by 20%. Still alternatively, successively pressing the key 71 three times will at first turn on the lighting device 6 with maximum brightness, followed by decreasing the brightness by 20%, and then further decreases the brightness by 20%. By using the driver system disclosed herein, a broad variety of remote control units may be used to control the operation of the lighting device 6 (including the operation states of ON and OFF, light and shade, and emitting light with particular color temperatures, etc.) without pairing the remote control units with the lighting device 6, and no decoding or demodulation processing is required. A user may simply press any key on a remote control unit to dim the brightness of light emitted from the lighting device 6.

The invention involves utilization of infrared remote control techniques to control an electrical device. Neither the pairing between the transmitter end and the receiver end, nor the incorporation of any demodulation circuit, is required in the invention. Further, by virtue of the ring counting function of the Johnson counter, pressing any key on the remote controller will cause the Johnson counter to output a control signal that shifts the operation of the electrical device from one operation state to another. In particular, the invention may be further provided with a voltage regulation unit adapted to output a specific control voltage upon receiving the control signal. The invention is particularly useful in dimming the brightness of light emitted from a remote lighting device.

The present invention provides a feasible driver system. The technical content and technical features of the invention have been disclosed above. However, those skilled in the art may still make various substitutions and modifications without departing from the spirit of the invention based on the disclosure provided herein. Therefore, the scope of protection of the invention should not be limited to those disclosed in the embodiments, and should include various substitutions and modifications without departing from the invention, and is covered by the following patent applications.

We claim:

1. A driver system, comprising:
   a receiver unit for receiving a signal and a low-pass filter for filtering the signal to generate a driving signal;
   a Johnson counter having an input terminal and a plurality of output terminals, wherein the Johnson counter is adapted to receive the driving signal via the input terminal and sequentially activate the output terminals, one at a time, following a predetermined counting sequence, thereby outputting a control signal for driving an electrical device; and
   a voltage regulation unit, comprising a plurality of resistors and a summing amplifier, the resistors being connected at one ends thereof to the output terminals of the Johnson counter, respectively, and connected at the other ends thereof to the summing amplifier, so that the control signal from the activated output terminal is converted by the resistor coupled to the activated output terminal and the summing amplifier, thereby outputting a control voltage for driving the electrical device.

2. The driver system according to claim 1, wherein the electrical device is a lighting device comprising a driving unit and at least one light emitting diode, the driving unit comprising:
   a rectifier circuit for connecting an AC power source and converting the AC power source into a DC power source;
   a switching power supply having a primary side and a secondary side, wherein the primary side is connected with the rectifier circuit and the voltage regulation unit, and wherein the secondary side is adapted to supply a predetermined level of power to the at least one light emitting diode.

3. The driver system according to claim 1, wherein the low-pass filter is a capacitor.

4. The driver system according to claim 1, wherein the signal received by the receiver unit is an infrared signal.

5. A driver system, comprising:
a receiver unit for receiving a signal and a low-pass filter for filtering the signal to generate a driving signal;
a Johnson counter having an input terminal and a plurality of output terminals, wherein the Johnson counter is adapted to receive the driving signal via the input terminal and sequentially activate the output terminals, one at a time, following a predetermined counting sequence, thereby outputting a control signal for driving an electrical device; and
a plurality of diodes and a voltage regulation unit, wherein the diodes are connected to the output terminals of the Johnson counter, respectively, and wherein the voltage regulation unit comprises a plurality of resistors and a divider resistor, the resistors being connected to the diodes, respectively, and connected in series with the divider resistor, so that a control voltage for driving the electrical device is output from the resistor connected to the activated output terminal according to the control signal.

6. The driver system according to claim 5, wherein one end of the divider resistor is connected in series with the resistors, and the other end of the divider resistor is grounded.

7. The driver system according to claim 5, wherein the electrical device is a lighting device comprising a driving unit and at least one light emitting diode, the driving unit comprising:
a rectifier circuit for connecting an AC power source and converting the AC power source into a DC power source;
a switching power supply having a primary side and a secondary side, wherein the primary side is connected with the rectifier circuit and the voltage regulation unit, and wherein the secondary side is adapted to supply a predetermined level of power to the at least one light emitting diode.

8. The driver system according to claim 5, wherein the low-pass filter is a capacitor.

9. The driver system according to claim 5, wherein the signal received by the receiver unit is an infrared signal.

10. A driver system, comprising:
a receiver unit for receiving a signal and a low-pass filter for filtering the signal to generate a driving signal;
a Johnson counter having an input terminal and a plurality of output terminals, wherein the Johnson counter is adapted to receive the driving signal via the input terminal and sequentially activate the output terminals, one at a time, following a predetermined counting sequence, thereby outputting a control signal for driving an electrical device; and
a plurality of 3-state buffers and a voltage regulation unit, wherein the 3-state buffers are connected to the output terminals of the Johnson counter, respectively, for receiving the control signal and outputting an isolated control signal, and wherein the voltage regulation unit comprises a plurality of resistors and a divider resistor, the resistors being connected with the 3-state buffers, respectively, and connected in series with the divider resistor, so that a control voltage for driving the electrical device is output from the resistor connected to the activated output terminal according to the control signal.

11. The driver system according to claim 10, wherein one end of the divider resistor is connected in series with the resistors, and the other end of the divider resistor is grounded.

12. The driver system according to claim 10, wherein the electrical device is a lighting device comprising a driving unit and at least one light emitting diode, the driving unit comprising:
a rectifier circuit for connecting an AC power source and converting the AC power source into a DC power source;
a switching power supply having a primary side and a secondary side, wherein the primary side is connected with the rectifier circuit and the voltage regulation unit, and wherein the secondary side is adapted to supply a predetermined level of power to the at least one light emitting diode.

13. The driver system according to claim 10, wherein the low-pass filter is a capacitor.

14. The driver system according to claim 10, wherein the signal received by the receiver unit is an infrared signal.

* * * * *